United States Patent
Takado

[11] Patent Number: 5,939,817
[45] Date of Patent: *Aug. 17, 1999

[54] SURFACE ACOUSTIC WAVE DEVICE

[76] Inventor: Heiji Takado, c/o NEC Corporation, 7-1, Shiba 5-chome, Minato-ku, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/531,594

[22] Filed: Sep. 21, 1995

[30] Foreign Application Priority Data

Sep. 22, 1994 [JP] Japan .................................. 6-227745

[51] Int. Cl.⁶ .................................................. H01L 41/053
[52] U.S. Cl. ..................... 310/348; 310/313 R; 310/344; 310/365
[58] Field of Search ............................ 310/313 R, 344, 310/348, 365

[56] References Cited

U.S. PATENT DOCUMENTS

| | | | |
|---|---|---|---|
| 3,723,834 | 3/1973 | Peters ................................... | 317/234 R |
| 4,635,354 | 1/1987 | Chrobak et al. .......................... | 29/622 |
| 4,795,934 | 1/1989 | Rogerson et al. ................... | 310/313 R |
| 5,101,553 | 4/1992 | Carey et al. ............................. | 29/882 |
| 5,195,142 | 3/1993 | D'Avolio et al. ........................ | 310/348 |
| 5,237,235 | 8/1993 | Cho et al. ............................ | 310/313 R |
| 5,256,480 | 10/1993 | Inoue et al. ................................ | 428/331 |
| 5,358,409 | 10/1994 | Obara ........................................ | 439/20 |
| 5,382,929 | 1/1995 | Inao et al. ................................. | 310/344 |
| 5,430,345 | 7/1995 | Takahashi ................................. | 310/348 |
| 5,459,368 | 10/1995 | Ohnishi et al. ...................... | 310/313 R |
| 5,604,667 | 2/1997 | Morimoto ................................ | 310/348 |
| 5,623,236 | 4/1997 | Yoshinaga et al. ...................... | 310/344 |

FOREIGN PATENT DOCUMENTS

| | | | |
|---|---|---|---|
| 57-111124 | 12/1955 | Japan . | |
| 53-42697 | 4/1978 | Japan .............................. | H03H 9/14 |
| 55-93238 | 7/1980 | Japan . | |
| 56-15118 | 2/1981 | Japan .............................. | H03H 9/25 |
| 56-58312 | 5/1981 | Japan .............................. | H03H 9/25 |
| 63-2162 | 1/1988 | Japan .............................. | H03H 3/007 |
| 63-263811 | 10/1988 | Japan .................................... | 310/313 R |
| 0001605 | 1/1991 | Japan ..................................... | 310/344 |
| 0190312 | 8/1991 | Japan .................................. | 310/313 R |
| 3289371 | 12/1991 | Japan ..................................... | 310/348 |
| 4-39730 | 4/1992 | Japan ............................. | H03H 9/10 |
| 4-44733 | 4/1992 | Japan ............................. | H03H 9/25 |
| 4-53320 | 5/1992 | Japan ............................. | H03H 9/25 |
| 4-170811 | 6/1992 | Japan ............................. | H03H 9/25 |
| 4-310009 | 11/1992 | Japan ............................. | H03H 9/25 |
| 5335878 | 12/1993 | Japan .................................. | 310/313 R |
| 6-53775 | 2/1994 | Japan .................................. | 310/313 R |

*Primary Examiner*—Thomas M. Dougherty
*Attorney, Agent, or Firm*—Scully, Scott, Murphy & Presser

[57] ABSTRACT

A surface acoustic wave element 11 having an inter digital electrode 12 formed on one surface of a piezo-electric substrate is arranged in a recess of a package 13 with the one surface being faced to a bottom surface of the recess of the package 13. An elastic conductive pad 35 having pads electrically connected to the electrode of the surface acoustic wave element 11 and electrodes of the package 13 is provided between the one surface of the surface acoustic wave element 11 and the package 13. The conductive pad 35 includes wiring means 35a, with which it is possible to connect the surface acoustic wave element 11 to the package 13 even when the position of the surface acoustic wave element in which the interdigital electrode is formed is deviated from the position of the electrodes of the package 13. The package 13 includes a cap 30 for pressing down the surface acoustic wave element 11. The surface acoustic wave element 11 is mounted on the conductive pad 35 in the package 13 with a surface of the surface acoustic wave element 11 on which the interdigital electrode is formed being down. Since the package 13 is hermetically sealed by the cap 30 while the surface acoustic wave element 11 being pressed down, the wire bonding becomes unnecessary, causing mounting to be facilitated. Further, the improvement of the quality of the device and its miniaturization are realized.

7 Claims, 8 Drawing Sheets

SURFACE ACOUSTIC WAVE DEVICE

BACKGROUND OF THE INVENTION

1. Field of the Invention

The present invention relates to a surface acoustic wave device and, particularly, to a surface acoustic wave device having a mounting structure with which a surface acoustic wave element (referred to as "chip", hereinafter) can be easily mounted on a surface of a support structure.

2. Description of Related Art

A conventional surface acoustic wave device is equipped with a chip which is a surface acoustic wave element comprising a piezoelectric substrate of such as $LiNbO_3$. On one surface of the chip, electrodes constituting at least a pair of inter digital transducers are formed. The electrodes usually takes in the form of an interdigital electrode.

The chip is put in a recess of a surface mounting package of ceramics through an upper opening thereof with the surface of the chip on which the inter digital transducers are formed being upside. The opposite surface of the chip is die-bonded onto a bottom portion of the package by adhesive. Connecting pads of the inter digital transducers on the chip are connected to required portions by wire bonding. The upper opening of the package is seam-welded with a cap through a seam ring provided on a peripheral portion of the opening to hermetically seal the whole package. Surface wave generated by the interdigital electrode on the upper surface of the chip is reflected at end faces thereof in the surface wave propagating direction and the reflected surface wave portion interferes the main surface wave, resulting in degradation of its filtering characteristics. In order to prevent such interference from occurring, sound absorbing material such as silicon is provided at necessary portions of the end faces of the chip.

A construction of such surface acoustic wave device in which a chip is mounted on a metal stem having lead terminals and covered with a cap hermetically welded by resistance welding is also known. In this construction, an interior of the surface acoustic wave device is also hermetically sealed. In fixing the chip to the metal stem, the surface of the chip on which the interdigital electrode is formed is made upside. The other surface of the chip is die-bonded to a bottom surface of the metal stem by means of adhesive. Thereafter, input/output pad portions of the inter digital transducers are electrically connected to the lead terminals of the metal stem by wire-bonding.

The lead terminals are supported by holes of the metal stem filled with glass material and electrically insulated from the metal stem by the glass material. In this conventional construction of the surface acoustic wave device, the metal stem usually takes in the form of a substantially flat metal plate and the cap is substantially cup shaped such that it can cover the metal stem while allowing the chip, etc., to be mounted on an upper surface of the metal stem.

According to the conventional surface acoustic wave device mentioned above, a fabrication method therefor requires the steps of painting adhesive and hardening it for the die-bonding step and the wire-bonding step, etc. Further, the steps of painting the sound absorbing material and hardening the latter, etc., may be required additionally. Therefore, the fabrication of such surface acoustic wave device takes a long time and a large investment of facility is required. Further, in the conventional surface acoustic wave device, the structure itself is complicated and the size of the device may be increased due to the necessity of keeping a required attitude of the chip with respect to the metal stem during an assembling thereof and of proving electrical connections between various portions thereof.

Further, since, in order to facilitate a surface mounting of the device on a surface of a support structure, metallized pad portions must be provided on the package for the wire bonding, the package must have a space large enough for the metallized pad portions. In addition, in order to provide the workability of wire-bonding for the chip kept horizontally, it is necessary to provide a space having depth corresponding to a thickness of the chip within the package.

In order to respond to such requirements, the surface mount type package must be formed by, for example, using a triple-surface structure of same material such as ceramics, resulting in high cost.

Japanese Utility Model Application Laid-open No. S56-15118 discloses a surface acoustic wave device of this type in which a chip is die-bonded to a package substrate. In this construction, a cap is made from an insulating thin plate having a conductor pattern formed thereon and electrode terminal portions of the chip are fixed to the conductor pattern portion. In this device, the wire-bonding step may be removed. However, in order to remove the wire-bonding step after the die-bonding, the conductor pattern on the cap must be directly fixed to the electrode terminals of the chip. This construction is not suitable for the surface mount type device. That is, when such surface acoustic wave device as mentioned above is made as a surface mount type, the package must be hermetically sealed by the cap by such as seam-welding. However, since the cap is of insulating material, such welding is impossible. Therefore, in order to obtain a hermetic seal, at least outer peripheral portions of bonded portions must be molded by resin or low melting point glass material. Since such air-tight sealing processing tends to influence the reliability of connection between the chip and the conductor pattern, it is difficult to make such conventional device surface mount type.

Particularly, since the package, the chip and the insulating thin plate which are made of different materials having different thermal expansion coefficients, thermal expansion of, for example, the package may generate stress in the chip and in the electrical connections to the chip, causing the frequency characteristics of the surface acoustic wave device to be unstable.

Further, in any of the conventional surface acoustic wave devices mentioned above, the chip is mounted in the package with the inter digital transducers formed on the chip being upside. Therefore, impurity and/or dust originated in the package tends to adhere to the transducers directly, causing the characteristics of the device to shift and the electrical characteristics of the device to be degraded.

Particularly, in the surface acoustic wave device disclosed in Japanese Utility Model Application Laid-open No. S56-15118, the steps of painting adhesive and hardening it for the die-bonding step and the wire-bonding step, etc., are required. Therefore, the fabrication thereof requires a long time and large investment of facility. In addition thereto, since the chip is arranged on the metal stem with the inter digital transducers formed on the chip being up side, impurity originated in the package and dust from a plating material of the cap when the cap is mounted on the package and/or dust scattered together with discharge (arc) generated during resistance welding of the cap tend to adhere directly onto the inter digital transducers, causing the electrical characteristics to be degraded.

Further, since the metal stem and the chip of the above-mentioned conventional surface acoustic wave device are rigidly fixed to each other by the adhesive, deformation stress generated during the hermetic seal by means of resistance welding, etc., tends to be transmitted to the chip directly, so that, with change of deformation stress with time, filtering frequency tends to be changed.

Japanese Patent Application Laid-open No. H4-310009 discloses a surface acoustic wave device in which, in order to make a signal connection possible without using wire-bonding, signal input/output electrodes face to electrodes on a circuit board onto which the device is to be mounted and are capacitively coupled thereto. Although such construction is effective when a chip of the device is directly mounted on the circuit board, it is not suitable as a surface mount type device which is usually an independent part.

Japanese Patent Application Laid-open No. H4-170811 discloses a surface acoustic wave device in which the wire-bonding step is removed by forming metal bumps on bonding pad portions of a chip such that the bumps are in contact with metallized pad portions of a package. In this device, however, in order to obtain a reliable contact connection between the metal bumps formed on the chip and the metallized pad portions of the package, the bumps must be formed such that the flatness of a horizontal plane defined by these bumps becomes maximized. If the flatness is not high, there may be contact points at which electrical connection is not obtained, resulting in significantly defective characteristics. Further, even if the electrical characteristics of the package as a unit part is obtained, it may be subjected to a small deformation such as warping due to stress generated when the package is mounted on a printed circuit board or a ceramic substrate of some apparatus, which causes the contact connection to the metal bumps to be degraded, resulting in a degradation of characteristics due to the defective electrical connection.

Further, in the conventional surface acoustic wave device mentioned above, when the metal bumps are fixedly connected to the package by pressing with heat, the deformation stress when the package is mounted on the printed circuit board or the ceramic substrate and stress due to expansion and contraction of the package due to thermal stress under environmental condition may be transmitted to the connecting portions of the metal bumps. In order to prevent this problem, the contact area and contact strength of the metal bumps must be considered sufficiently.

SUMMARY OF THE INVENTION

An object of the present invention is to facilitate a mounting of a surface acoustic wave device and to improve the hermetic sealing and electric conductivity to thereby miniaturize the device itself and reliability of the device.

In more detail, an object of the present invention is to facilitate the surface mounting of the surface acoustic wave device, to simplify a support structure of a surface wave element thereof and to simplify the assembling step thereof to thereby improve the stability and reliability of the device due to the improved hermetic sealing and electrical conduction and miniaturize the device and reduce the manufacturing cost.

In a surface acoustic wave device according to the present invention, a chip constituting an elastic surface wave element composed of a piezoelectric substrate and an interdigital electrode (inter digital transducers) formed thereon is arranged in a package such that the surface of the chip on which the inter digital transducers are formed faces to a bottom surface of the package. An elastic, electrically conductive pad having a shape which contacts with at least the electrode portion is interposed between the surface of the chip on which the inter digital transducers are formed and the bottom surface of the package. The electrically conductive pad used in the present invention includes a rectangular ring shaped pad of, for example, silicon rubber with metal filaments embedded therein in only one direction.

The package of the surface acoustic wave device according to the present invention is hermetically sealed with a cap hermetically closing an opening of the package by bonding. The chip and the conductive pad are hermetically sealed in a state where they are pressed down by the cap. A buffer sheet of an elastic material having an arbitrary shape is provided between the cap and the chip to regulate the pressing force of the cap. By forming a rectangular hole in a center portion of the buffer sheet, it is possible to concentrate the pressing force in an outer peripheral portion of the chip.

Further, in an aspect of the surface acoustic wave device of the present invention, the cap is put on the surface acoustic wave element to cover the package and hermetically seals the latter by such as resistance welding. In this case, the surface acoustic wave element is pressed down by the cap. With this downward force exerted by the cap, the conductive sheet provided between the surface acoustic wave element and the package is elastically deformed to provide electrical connection therebetween. In the elastic surface wave device of the present invention, it is possible to improve the mounting procedure and the reliability thereof by providing a guide for positioning the conductive pads or the surface acoustic wave element in the package.

In another aspect of the surface acoustic wave device of the present invention, the pressing force to be provided by the cap closing the opening of the surface mount type package is provided by drawing the cap arbitrarily and hermetically sealing the package with the cap. In order to make the pressing force regulatable, a flexible buffer sheet having an arbitrary shape is provided between the cap and the chip. For example, by forming a rectangular hole in a central portion of the buffer sheet, it is possible to concentrate the pressing force in an outer peripheral portion of the chip.

BRIEF DESCRIPTION OF THE DRAWINGS

The above-mentioned and other objects, features and advantages of the present invention will become more apparent from the following detailed description when taken in conjunction with the accompanying drawings wherein.

DETAILED DESCRIPTION OF THE PREFERRED EMBODIMENTS

Figure 1:
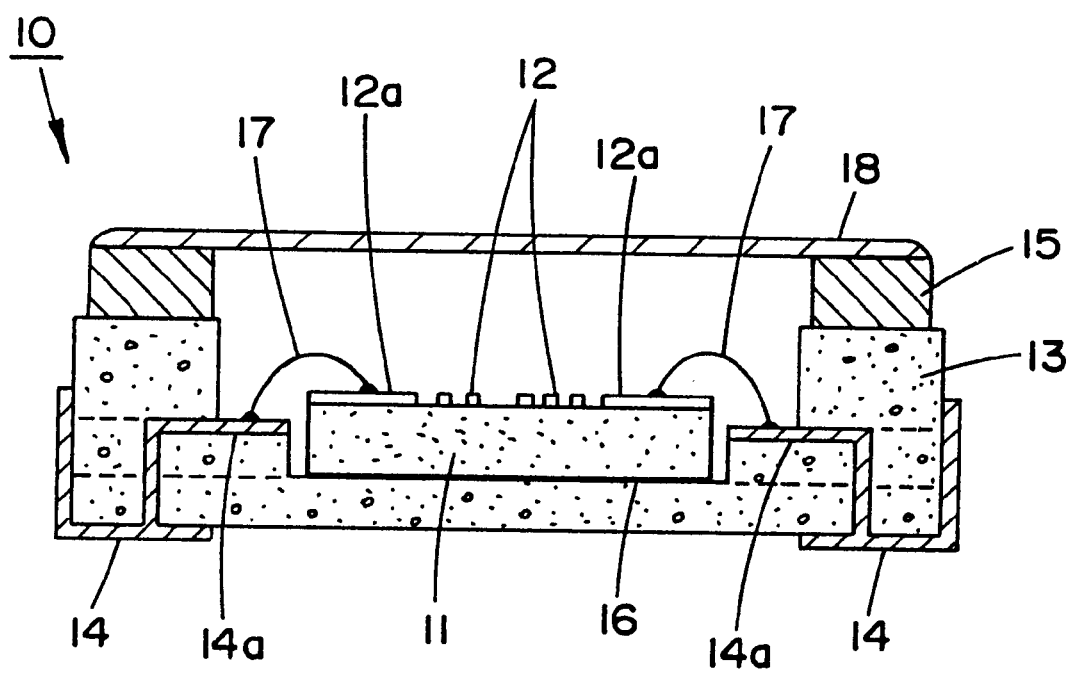
FIG. 1 is a longitudinal cross section showing a conventional surface acoustic wave device.

In order to facilitate an understanding of the present invention, a structure of a conventional surface acoustic wave device will be described in brief before describing the surface acoustic wave device according to the present invention. FIG. 1 is a cross sectional view of the conventional surface acoustic wave device.

The surface acoustic wave device depicted as a whole by a reference numeral 10 includes a chip 11 which is of a piezoelectric material as an elastic surface wave element. On one surface (upper surface) of the chip 11, an interdigital electrode 12 constituting at least a pair of inter digital transducers is formed.

The chip 11 is arranged in a recess formed in a surface mount package 13 of a ceramic material with the upper surface formed with the interdigital electrode 12 being upside. The other surface (lower surface) of the chip 11 is die-bonded to a bottom surface of the package 13 by means of an adhesive 16. An electrical connection of the chip 11 is obtained by wire-bonding input/output pad portions 12a of the inter digital transducers to metallized pad portions 14a formed on a portion of a bottom surface side of the package 13 through conductive wires 17. A cap 18 is put on the package 13 to cover an opening of the recess thereof through a seam ring 15 and a peripheral portion of the cap 18 is welded to the package 13 to hermetically seal an interior of the package.

Figure 2:
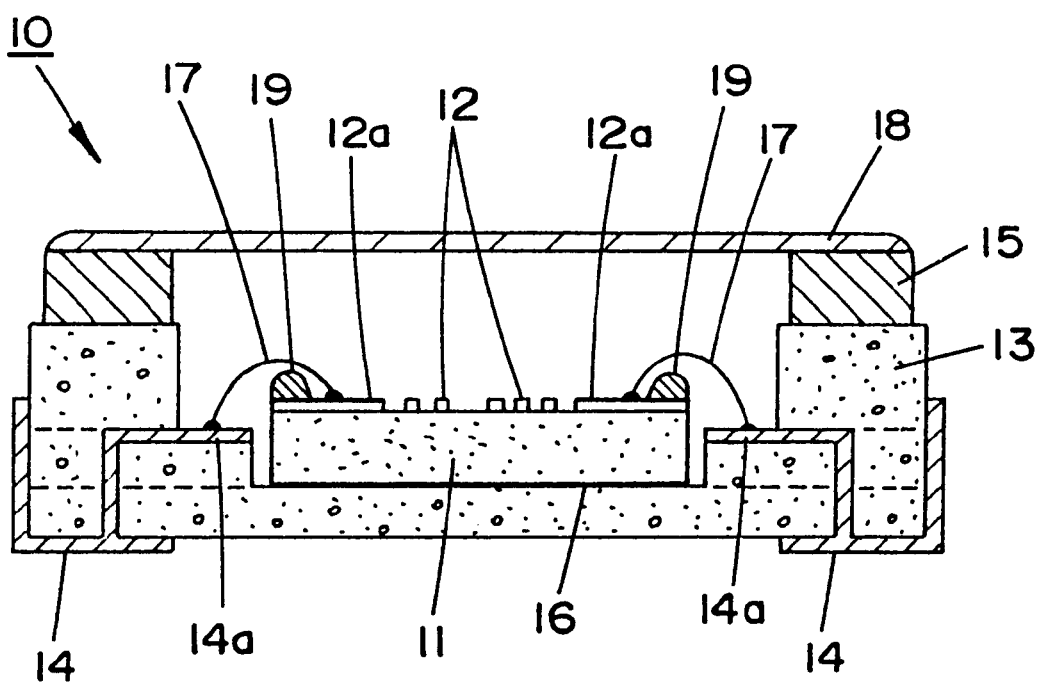
FIG. 2 is a longitudinal cross section showing another conventional surface acoustic wave device.

Surface wave generated by the inter digital transducers on the upper surface of the chip 11 is reflected at end faces of the chip 11 in a wave propagating direction and a reflected wave portion interferes with the main surface wave, causing a filtering characteristics of the chip 11 to be degraded. In order to prevent the filtering characteristics of the chip 11 from being degraded by reflection, sound absorbing material 19 such as silicon is provided in suitable positions of the end face of the chip 11 as shown in FIG. 2.

Figure 3:
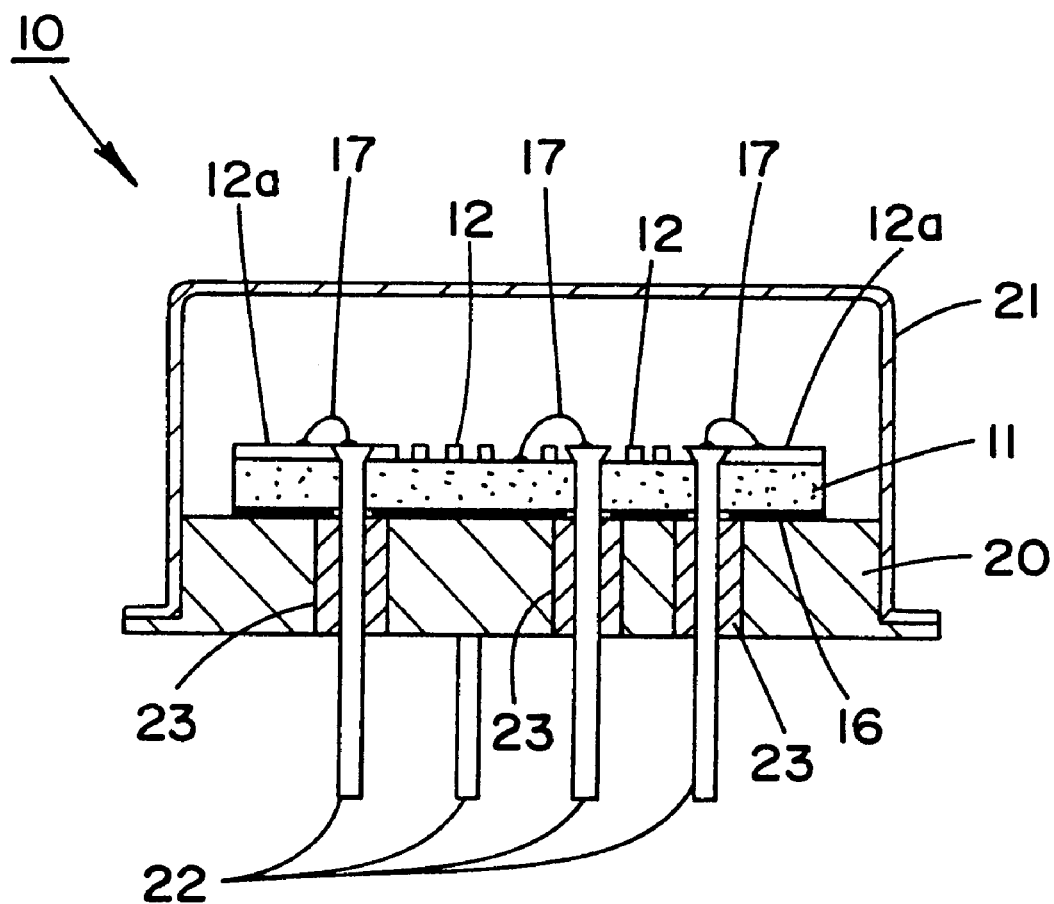
FIG. 3 is a longitudinal cross section showing a further conventional surface acoustic wave device.

FIG. 3 shows a construction of another example of the conventional elastic surface wave device. In FIG. 3, a chip 11 is mounted on a metal stem 20 with a surface of the chip 11 on which an interdigital electrode 12 is formed being upside. The metal stem 20 having the chip 11 mounted thereon is covered and hermetically sealed by a cap 21 by means of such as resistance welding. The other surface of the chip 11 is die-bonded to the metal stem 20 through an adhesive 16. An electrical connection of the chip 11 is obtained by wire-bonding input/output pad portions 12aof inter digital transducers constituted with the interdigital electrode 12 to lead terminals 22 formed on the metal stem 20 through conductive wires 17. The lead terminals 22 are arranged in respective through-holes formed in the stem 20 and fixed therein by glass material 23 filling the through-holes.

In the conventional surface acoustic wave device shown in FIG. 3, the stem 20 takes in the form a flat plate and the cap 21 takes in the form of an inverted cup shape so that it can cover the stem 20 having the chip 11 mounted thereon.

An embodiment of the present invention will now be described with reference to FIG. 4.

Figure 4:
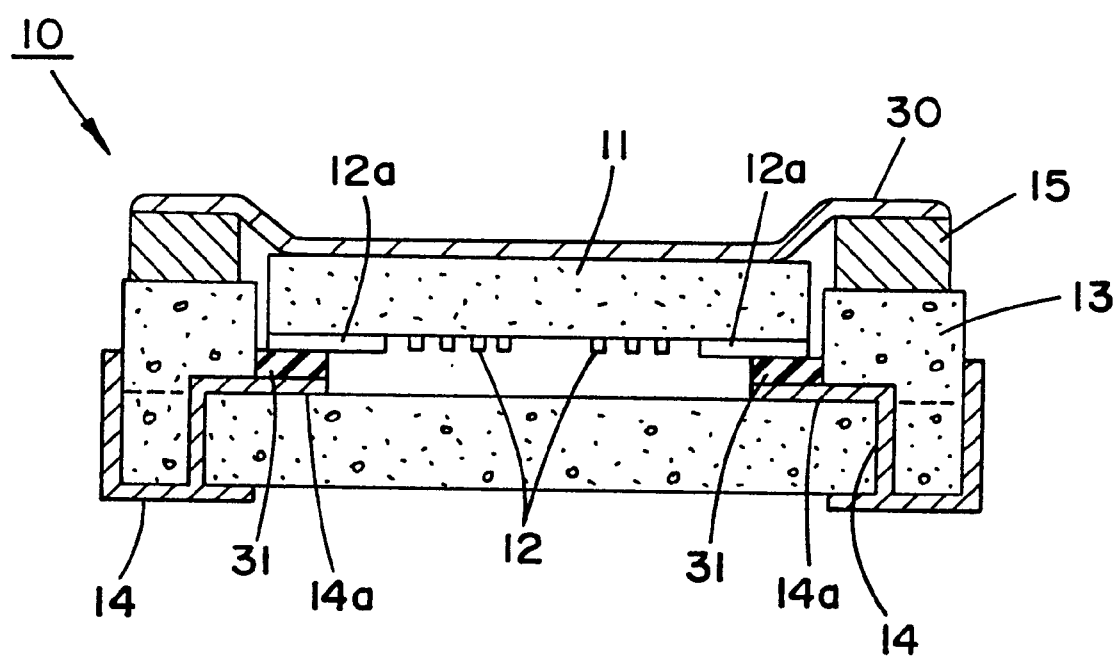
FIG. 4 is a longitudinal cross section showing a main portion of a first embodiment of a surface acoustic wave device according to the present invention.

FIG. 4 shows the embodiment of the surface acoustic wave device according to the present invention, in which same or corresponding components as those shown in FIGS. 1 and 2 are depicted by same reference numerals as those used in these figures, respectively, without detailed description thereof.

According to the present invention, a chip 11 of the surface acoustic wave device 10, which comprises a piezoelectric substrate and an interdigital electrode 12 which constitutes inter digital transducers formed on one surface of the piezoelectric substrate, is arranged in a recess of a surface mount package 13 of such as ceramic material with the one surface thereof being down. Elastic, electrically conductive pads 31 are interposed between the one surface of the chip 11 and a bottom surface of the recess. An electrical connection between input/output pad portions 12a of the interdigital electrode 12 constituting the inter digital transducers of the chip 11 and the package 13 is provided by the conductive pads 31 which are in contact with metallized pad portions 14a of a metallized pattern 14 exposed in the bottom surface of the recess of the package 13.

Further, according to the present invention, a cap 30 which covers an opening of the recess of the surface mount package 13 is drawn suitably. The cap 30 hermetically seals the package 13 while pressing down the chip 11 by welding the cap to the package.

As shown in FIG. 4, the cap 30 contacts with the other surface of the cap 11. Since the chip 30 is drawn so that a center portion thereof protrudes downward, the center portion serves to elastically press the one surface of the chip 11 down to the bottom of the recess of the surface mount package 13 with a required pressure.

The whole chip-package assembly is hermetically sealed by welding a peripheral portion of the cap 30 to a peripheral portion of the opening of the recess of the package 13 through a seam ring 15. As mentioned previously, the electrical connection between the input/output pad portions 12a of the interdigital electrode 12 constituting the inter digital transducers of the chip 11 and the package 13 is provided by the conductive pads 31 in contact with the metallized pad portions 14a of the metallized pattern 14, which are exposed in the bottom surface of the recess of the package 13.

According to the simple construction shown in FIG. 4 and described above, the die-bonding step for fixing the chip 11 by adhesive and the wire-bonding step for obtaining the electrical connection between the chip 11 and the surface mount package 13, which are unavoidable in the conventional device, become unnecessary and a fabrication of the surface acoustic wave device according to this embodiment is substantially simplified.

Further, since the chip 11 is fixed to the package 13 by not the adhesive but the pressure holding force produced by the combination of the cap 30 and the elastic conductive pads 31, stress exerted on the chip 11 due to difference in thermal expansion coefficient between the chip 11 and the package 13 is minimized and so the frequency characteristics of the surface acoustic wave device becomes stabilized.

When the surface mount package 13 is made of ceramics, it has been necessary to provide a triple-surface structure including a surface of the package on which the cap is arranged, the bottom surface of the recess of the package and a surface in the recess on which the bonding pads to be wire-bonded to the chip are formed. In the present invention, however, the package can be constructed as a double-surface structure since there is no need of the wire-bonding. Therefore, it is possible to reduce the cost of the package 13.

Further, in the present invention, the inter digital transducers formed on the chip 11 face to the bottom surface of the recess of the package 13, it is possible to prevent impurity or dust (for example, fine particles of a thin metal film plated on the cap) produced within the package 13 from being directly deposited on the inter digital transducers, to thereby prevent any shift of characteristics of the device due to deposition of impurity from occurring and prevent the electrical characteristics of the device from being degraded.

Now, a second embodiment of the elastic surface wave device according to the present invention will be described with reference to FIGS. 5 and 6 in which same or corresponding components as those shown in FIGS. 1, 2 and 4 are depicted by same reference numerals as those used in these figures, respectively, without detailed description thereof.

The surface acoustic wave device 10 according to the second embodiment comprises an electrically conductive, elastic pad 35 in the form of a rectangular ring disposed between a chip 11 formed by a piezoelectric substrate and an interdigital electrode (inter digital transducers) 12 formed on the substrate and a bottom surface of a recess of a surface mount package 13, which is faced to the surface of the chip on which the interdigital electrode 12 is formed. The conductive pad 35 functions to provide an electrical connection between the chip 11 and the package 13 similarly to the function of the conductive pads 31 of the first embodiment shown in FIG. 4. In the second embodiment, however, the conductive pad 35 is formed of an electrically conductive matrix of such as silicon rubber and metal filaments 35a embedded in the silicon matrix and extending in only one direction. Therefore, the conductive pad 35 serves as a connector allowing current to pass in the one direction through the metal filaments.

As mentioned above, the electrical connection between input/output pad portions 12a of the interdigital electrode 12 constituting the inter digital transducers of the chip 11 and metallized pad portions 14a of a metallized pattern 14 exposed in the bottom surface of the recess of the package 13 is provided by the metal filaments 35a embedded in the rectangular ring shaped conductive pad 35.

Further, according to the second embodiment, a cap 30 which is drawn suitably is bonded to hermetically close the opening of the recess of the surface mount package 13 of ceramic. In order to hermetically seal the package 13 while pressing down the chip 13 with a controlled pressing force, an elastic buffer sheet 36 having an arbitrary shape is provided between the cap 30 and the chip 11. In this embodiment, the elastic buffer sheet 36 is formed with a center hole so that the pressing force is exerted concentrically on an outer peripheral portion of the chip 11. FIG. 6 is a perspective view of the second embodiment with the constitutional components thereof being disassembled. In FIG. 6, the inter digital transducers and the seam ring 15, etc., are removed for simplicity of illustration.

Figure 5:
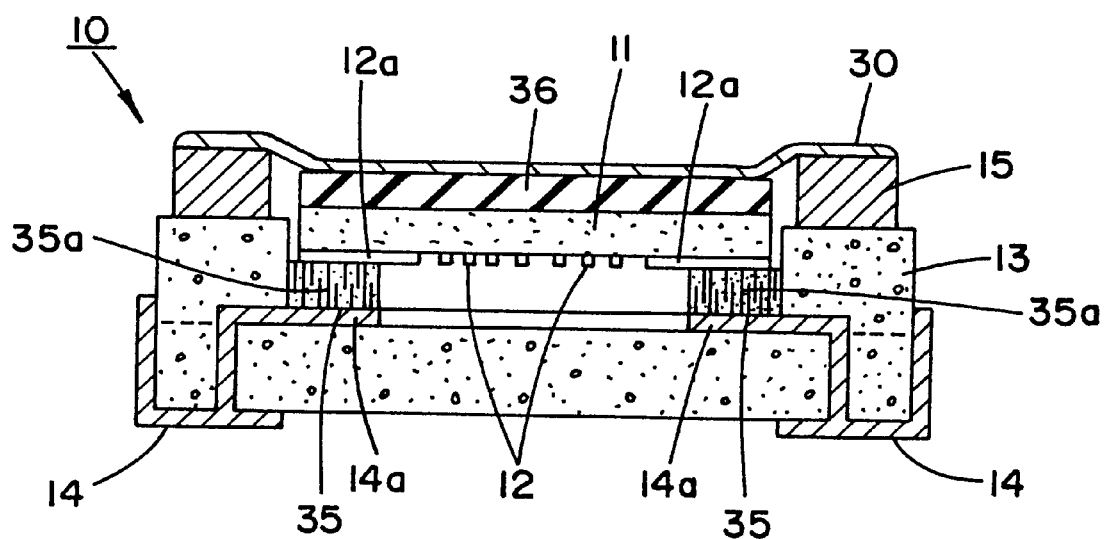
FIG. 5 is a longitudinal cross section showing a main portion of a second embodiment of a surface acoustic wave device according to the present invention.
Figure 6:
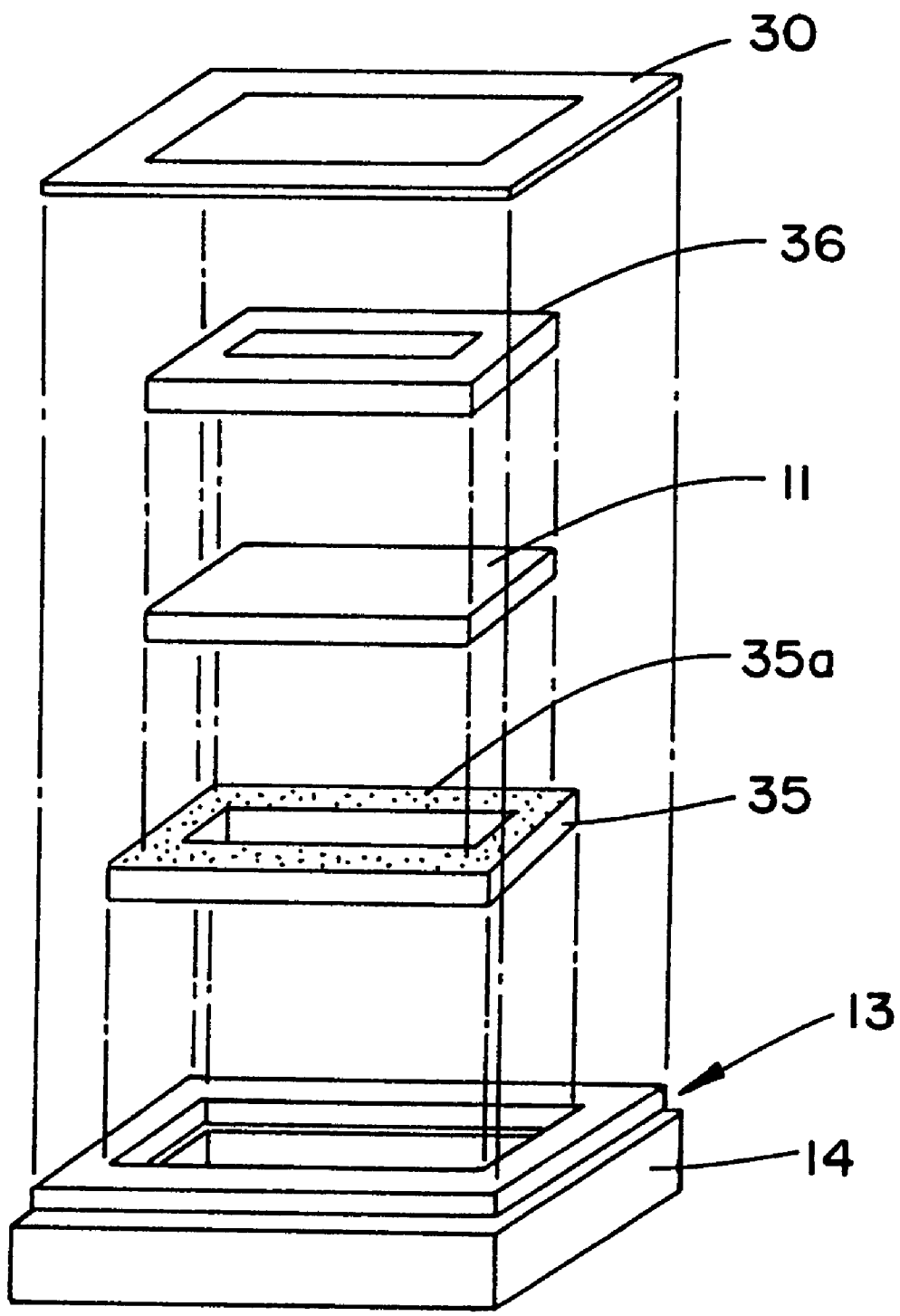
FIG. 6 is a perspective view showing the main portion shown in FIG. 5 in disassembled state.

With the construction of the surface acoustic wave device shown in FIGS. 5 and 6 and described above, in which the rectangular ring shaped conductive pad 35 is arranged on the bottom surface of the recess of the surface mount package 13, the surface of the piezoelectric substrate of the chip 11 on which the inter digital transducers are formed is faced to the bottom surface of the recess of the package 13 through the conductive pad 35 and the electrical connection between the chip 11 and the package 13 is provided by the unidirectionally extending metal filaments 35a embedded in the conductive pad 35.

In the assembled state of the package of the surface acoustic wave device of the second embodiment, the cap 30 is combined with the package. The cap 30 has a peripheral portion, which corresponds to an edge portion of the opening of the recess of the package 13 and is drawn so that a center portion of the cap 30 is fitted in the recess of the package 13, and is welded to the edge portion of the recess while pressing down the chip 11 through the buffer sheet 36 to hermetically seal the whole package, resulting in the surface acoustic wave device 10 suitable for surface mount.

With the simple construction and the simple fabrication method of the second embodiment, the die-bonding step for fixing the chip to the package by adhesive and the wire bonding step for electrically connecting the chip to the surface mount package, which are necessary in the conventional surface acoustic wave device, are also unnecessary. Further, the sound absorbing member 19 (see FIG. 2) for preventing surface wave generated by the inter digital transducers from being reflected at the end faces of the chip in the wave propagating direction is also unnecessary due to the pressure contact between a portion of the rectangular conductive pad 35 and the end face portions of the chip 11. Therefore, the painting step of painting the end face portions of the chip with sound absorbing material can also be removed and thus the manufacture of the surface acoustic wave device is further simplified.

Further, since the chip 11 is made in contact with the package 13 by not adhesive but the pressing force of the cap 30 and the electrical connection of the chip 11 to the package 13 is provided by the rectangular conductive pad 35 to which the chip 11 is intimately contacted by the pressing force of the cap 30, stress load of the chip 11 due to the difference in thermal expansion coefficient between it and the package 13 is minimized, resulting in a stable frequency characteristics of the surface acoustic wave device.

When the surface mount package 13 is made of ceramics, the three surface structure is necessary in the past. In the present invention, however, only two surfaces, that is the bottom surface of the recess of the package 13 and the upper surface of the package 13 which corresponds to an upper surface of the recess for housing the chip 11, are necessary, since the wire-bonding is unnecessary. Although not shown, it is possible, alternatively, to concurrently use the seam ring 15 as the recess for housing the chip 11. In such case, the number of surfaces of the package may be reduced to one and the package 13 is extremely simplified and low cost.

Further, since the inter digital transducers formed on the chip 11 are faced to the bottom surface of the recess of the package 13, it is possible to prevent impurity or dust, for example, fine particles of a thin metal film plated on the cap, produced within the package 13 from being directly deposited on the inter digital transducers, to thereby prevent any shift of characteristics of the device due to deposition of impurity from occurring and prevent the electrical characteristics of the device from being degraded.

In the second embodiment shown in FIGS. 5 and 6, the cap 30 is not always drawn. In such case, instead of the pressing force of the cap 30 which is drawn, elasticity of the buffer sheet 36 is used to provide the pressing force necessary to press contact the chip with the surface mount package 13.

Figure 7:
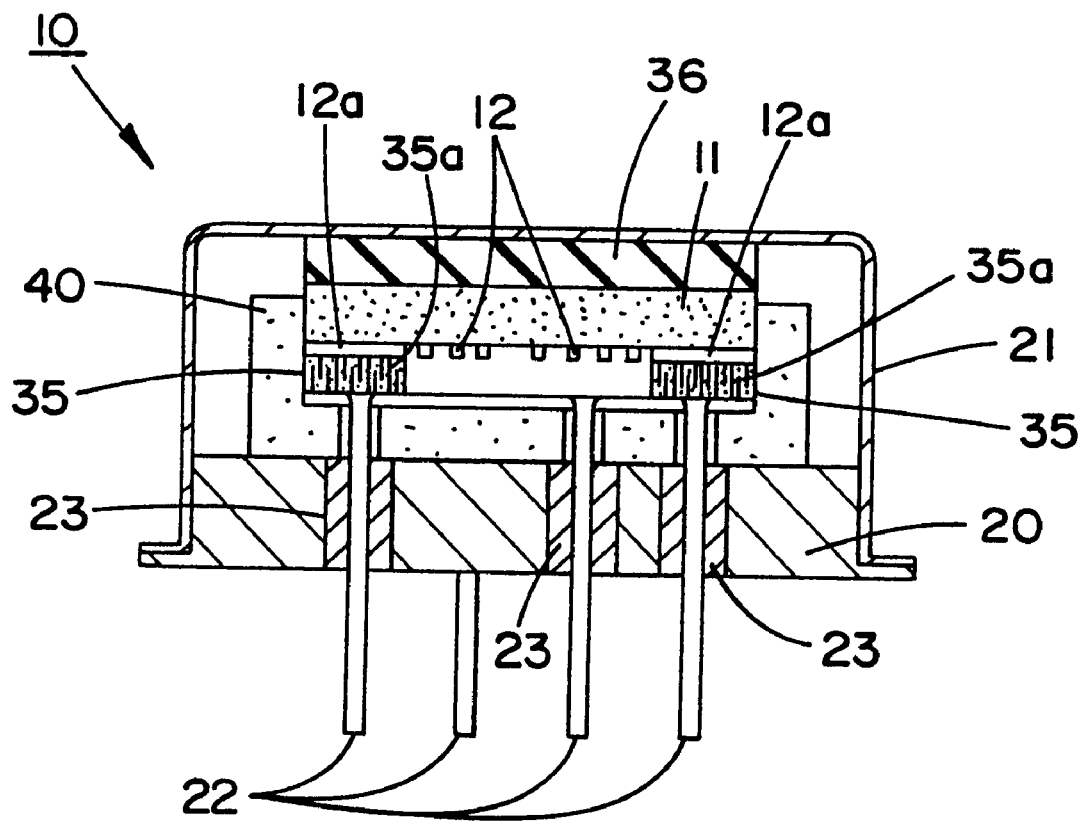
FIG. 7 is a longitudinal cross section showing a main portion of a third embodiment of a surface acoustic wave device according to the present invention.

FIG. 7 shows a third embodiment of the surface acoustic wave device according to the present invention, in which same or corresponding components as those shown in FIGS. 1, 2 and 4 to 6 are depicted by same reference numerals as those used in these figures, respectively, without detailed description thereof.

In the third embodiment, the surface acoustic wave device 10 is composed of a metal stem 20 in the form of a flat metal plate, a cap 21 which is drawn and a chip 11 composed of a piezoelectric substrate and inter digital transducers formed on a lower surface of the piezoelectric substrate. The inter digital transducers of the chip 11 are faced to inner end portions of lead terminals 22 while being insulated from the metal stem 20. Between the inner end portions of the lead terminals 22 and the inter digital transducers, an elastic conductive pad 35 which may be the rectangular ring such as shown in FIGS. 5 and 6 is provided. The conductive pad 35 in this embodiment is a connector which may be composed of a silicon rubber matrix embedded with unidirectional metal filaments 35a. The connector allows current to flow in only one direction so that the inner end portions of the lead terminals 22 are electrically connected to the inter digital transducer pad portions 12a of the chip 11 through the embedded metal filaments 35a. As mentioned above, a portion of the conductive pad 35 is removed to provide the rectangular ring form so that a space is provided below the inter digital transducers.

Further, in the third embodiment, a buffer member 36 having an arbitrary shape is provided between the chip 11 and the cap 21 so that the chip 11 is pressed down with a uniform pressing force within the cap 21 and a recessed guide 40 of an insulating material such as ceramics is provided between the chip 11 and the metal stem 20. The guide 40 receives the chip 11 to position the latter.

In this construction, the lead terminals 22 supported by the metal stem 20 through glass material 23 and passed through the guide 40 are electrically connected to the input/output pad portions 12a of the inter digital transducers formed on the lower surface of the piezoelectric substrate through the metal filaments 35a of the conductive pad 35 in only one direction.

With the guide 40 for positioning the chip 11, the manufacturing process of the elastic surface wave device 10 having various effects is facilitated within a short time.

Figure 8:
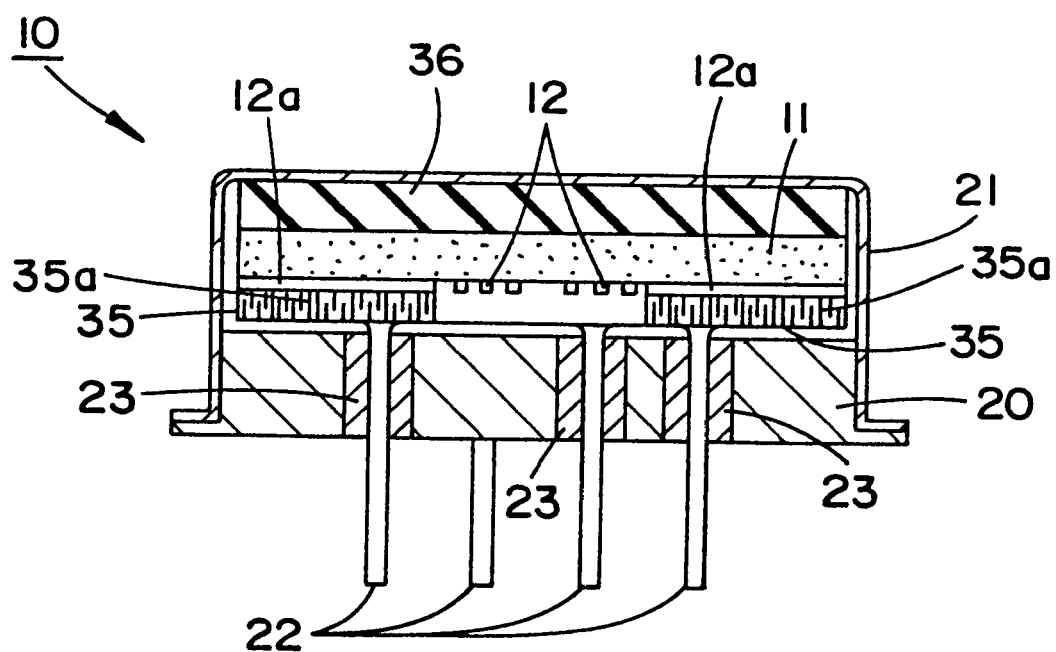
FIG. 8 is a longitudinal cross section showing a main portion of a fourth embodiment of a surface acoustic wave device according to the present invention.

FIG. 8 shows a fourth embodiment of the present invention, in which the guide for positioning a chip is removed. With the fourth embodiment, the merits of the present invention can be obtained.

It should be noted that the present invention is not limited to the described embodiments and shapes and constructions of the various components of the elastic surface wave device 10 may be modified suitably in various manners within the scope of the present invention.

For example, the cap 30 or 21 which is bonded to the opening of the surface mount package 13 or the metal stem 20 may be shaped to any shape by drawing so long as a portion of the cap drawn, when assembled, provides a uniform pressing force to the surface of the chip 11 on which the inter digital transducers are formed.

Further, in FIG. 5, the recess for receiving the chip 11 is formed in the package 13. However, it is possible to use a flat package 13 together with a cup shaped cap 30. In such case, the cap 30 may be hermetically sealed to the flat package by glass seal or solder seal, etc., while pressing the chip 11 down by a bottom portion of the cup shaped cap 30.

The configuration of the conductive pad 35 which is shown in FIGS. 5 and 6 as the rectangular ring may be modified arbitrarily. For example, a center portion thereof which corresponds to the inter digital transducers may not be removed completely and modified suitable by taking positions from which electric signal is to be derived into consideration. Further, the elastic buffer sheet 36 provided between the chip 11 and the cap 30 may be removed if necessary.

As described, the elastic surface wave device according to the present invention includes the chip which is the surface acoustic wave element having the interdigital electrode (inter digital transducers) formed on the piezoelectric substrate thereof and is arranged such that the surface having the inter digital transducers faces to the bottom surface of the recess of the surface mount package, and the electrical connection between the chip and the package is realized by the elastic conductive pad or the elastic conductive pad in the form of the rectangular ring provided therebetween.

Therefore, the surface acoustic wave device according to the present invention is simple in construction and has the following merits:

First, the die-bonding step for fixing the chip by using adhesive and the wire-bonding step for electrically connecting the chip to the surface mount package which are indispensable in the conventional package are unnecessary. Therefore, the manufacture of the surface acoustic wave device is much simplified and hence the manufacturing facility therefor can be substantially simplified.

Second, the cap which is suitable drawn and adapted to hermetically close the opening of the surface mount package is used to reliably hold the chip within the recess of the package through the elastic conductive pad under pressure. Therefore, there is no need of fixing the chip within the recess by using adhesive and stress due to the adhesion is reduced, resulting in that stress exerted on the chip due to the difference in thermal expansion coefficient between the chip and the package is minimized. Thus, the reliability and the frequency characteristics of the surface acoustic wave device are improved.

Third, since the wire bonding is unnecessary in the present invention, there is no need of providing the three-surface structure , that is the bottom surface of the recess of the package, the surface of the recess on which the wire bonding between the chip and the package is performed and the upper surface of the package, which is necessary in the past when the surface mount package is made of ceramics, etc. That is, the surface mount package of the present invention can be manufactured with the two surface or even a single surface structure, resulting in reduction of the package cost and reduction of the area and the thickness of the package.

Fourth, since the chip is arranged in the recess of the package with the surface of the chip on which the inter digital transducers are formed being faces to the bottom surface of the recess of the package, it is possible to prevent impurity or dust, for example, fine particles of a thin metal film plated on the cap, produced within the package 13 from being directly deposited on the inter digital transducers, to thereby prevent any shift of characteristics of the device due to deposition of impurity from occurring and prevent the electrical characteristics of the device from being degraded.

In the conventional surface acoustic wave device, surface wave generated by the interdigital electrode on the upper surface of the chip is reflected at an end face in a wave propagating direction of the surface wave and the reflected surface wave portion interferes the main surface wave, resulting in degradation of its filtering characteristics. In order to prevent such interference from occurring, necessary portions of the end faces of the chip are painted with sound absorbing material such as silicon which is hardened thereafter. contrary to the conventional device, the rectangular ring shaped conductive pad provided between the chip and the bottom surface of the recess of the package can serve the same function as that of the sound absorbing material provided on the end faces of the chip. Therefore, in the present invention, the step of providing and hardening the sound absorbing material can be removed, which contributes to the simplification of the manufacture of the device.

According to the present invention, even if deforming stress, generated when the surface acoustic wave device is surface-mounted on a printed circuit board or a ceramic substrate is exerted on the chip, the elastic conductive pad used to connect the chip to the package absorbs such stress.

Further, according to the present invention, it is possible to prevent impurity originated in the package and dust from a plating material of the cap when the cap is bonded to the package and/or dust scattered together with discharge (arc) generated during hermetic sealing of the cap by means of such as resistance welding from directly adhering onto the inter digital transducers.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A surface acoustic wave device comprising:

a surface acoustic wave element comprising a piezoelectric substrate and an interdigital electrode formed on one surface of said piezoelectric substrate, said interdigital electrode having connection pads;

mounting means for mounting said surface acoustic wave element, said mounting means having a mounting surface which faces said one surface of said piezoelectric substrate and having mounting pads formed on portions of said mounting surface;

electric connection means, which includes a conductive pad formed of an electrically non-conductive and elastic material, for electrically connecting said connection pads of said interdigital electrode to said mounting pads of said mounting means, said elastic material having a plurality of conductive filaments embedded therein, electrically isolated from each other and extending in only one direction from said conductive pads to said mounting pads for allowing current to pass between said connection pads and said mounting pads while preventing current from passing between adjacent filaments; and a cap disposed on said mounting surface for hermetically sealing said mounting means while pressing said surface acoustic wave element toward said mounting means.

2. The surface acoustic wave device claimed in claim 1, further comprising a buffer sheet disposed between said cap and an acoustic wave element surface which is opposite said one surface of said acoustic surface wave element.

3. The surface acoustic wave device claimed in claim 1, wherein said mounting means includes a surface mount electrode pad formed on an opposite surface thereof to said surface on which said surface acoustic wave element is mounted.

4. The surface acoustic wave device claimed in claim 1, wherein said mounting means includes lead terminals formed on a surface thereof opposing to said mounting surface on which said surface acoustic wave element is mounted and extending perpendicularly to said surface acoustic wave element.

5. The surface acoustic wave device claimed in claim 1, wherein said electrically conductive and elastic material includes silicon rubber and metal filaments.

6. The surface acoustic wave device claimed in claim 1, wherein said electric connection means is continuous under a periphery of said surface acoustic wave element and is located between said connecting pads of said interdigital electrode and said mounting pads of said mounting means.

7. The surface acoustic wave device claimed in claim 1, wherein said conductive pads and mounting pads are substantially parallel to each other and wherein said conductive filaments are perpendicular to said mounting and conductive pads.

* * * * *

UNITED STATES PATENT AND TRADEMARK OFFICE
CERTIFICATE OF CORRECTION

PATENT NO. : 5,939,817
DATED : August 17, 1999
INVENTOR(S) : Haiji Takado

It is certified that error appears in the above-identified patent and that said Letters Patent is hereby corrected as shown below:

On The Title Page, After Section [76], Insert the following

--[73] Assignee: NEC Corporation, Tokyo, Japan--

Column 7, Line 46: "Fig. 6" should begin new paragraph.

Column 11, Line 4: "substrate is" should read --substrate, is--

Signed and Sealed this

Nineteenth Day of December, 2000

Q. TODD DICKINSON

Attest:

Attesting Officer

Commissioner of Patents and Trademarks